United States Patent
Leeson (10) Patent No.: US 10,113,527 B2
(45) Date of Patent: Oct. 30, 2018

(54) SPARK PLUG TESTING KIT

(71) Applicants: John Leeson, Castle Hill (AU); Darren Leeson, Willoughby (AU); Justine Leeson, Greystones Co Wicklow (IE)

(72) Inventor: John Leeson, Castle Hill (AU)

(73) Assignees: John Leeson, Castle Hill (AU); Darren Leeson, Willoughby (AU); Justine Leeson, Greystones Co Wicklow (IE)

( * ) Notice: Subject to any disclaimer, the term of this patent is extended or adjusted under 35 U.S.C. 154(b) by 0 days.

(21) Appl. No.: 15/533,335

(22) PCT Filed: Apr. 28, 2016

(86) PCT No.: PCT/AU2016/050303
§ 371 (c)(1),
(2) Date: Jun. 5, 2017

(87) PCT Pub. No.: WO2016/172767
PCT Pub. Date: Nov. 3, 2016

(65) Prior Publication Data
US 2017/0328335 A1  Nov. 16, 2017

(30) Foreign Application Priority Data
Apr. 30, 2015  (AU) ................................ 2015901555

(51) Int. Cl.
*F02P 17/12* (2006.01)
*H01T 13/58* (2011.01)
(Continued)

(52) U.S. Cl.
CPC .............. *F02P 17/12* (2013.01); *G01R 31/00* (2013.01); *H01T 13/58* (2013.01); *H01T 21/02* (2013.01)

(58) Field of Classification Search
CPC ......... H01T 13/58; H01T 13/60; H01T 21/02; H01T 13/06; F02P 17/12; F02P 17/00; G01R 31/006
See application file for complete search history.

(56) References Cited

U.S. PATENT DOCUMENTS 1,695,557 A    12/1928  Myers
1,914,809 A *   6/1933  Kongsted ................ F02P 17/00
                                                   324/397

(Continued)

OTHER PUBLICATIONS

Australian International-type Search Report dated Dec. 14, 2015 from corresponding Australian Application No. 2015901555.
(Continued)

*Primary Examiner* — Patrick Assouad
*Assistant Examiner* — Haidong Zhang
(74) *Attorney, Agent, or Firm* — Innovation Capital Law Group, LLP; Vic Lin (57) ABSTRACT

There is provided a spark plug testing kit for safe and convenient testing of petrol engines. The testing kit has a spark observation device within which a spark gap of a spark plug installed therein may be observed in use. The kit has a positive lead for connection to the engine distributor and an earth lead configured for connection to a spark plug opening engaging device. The spark plug engaging opening device comprises threading for turning into a spark plug socket of an engine block and defines an elongate male electrical connection nut standing proud therefrom over which a corresponding electrical connection of the earth lead may be easily and safely electrically connected. The spark plug engaging opening device further comprises exhaust ports through a side of the device for engine decompression during cranking.

13 Claims, 7 Drawing Sheets

(51) Int. Cl.
*H01T 21/02* (2006.01)
*G01R 31/00* (2006.01)

(56) References Cited

U.S. PATENT DOCUMENTS

| | | | |
|---|---|---|---|
| 2,069,046 A * | 1/1937 | Rabezzana | H01T 13/05 |
| | | | 174/397 |
| 2,303,389 A * | 12/1942 | Rabezzana | H04B 15/025 |
| | | | 174/397 |
| 2,634,089 A * | 4/1953 | Sheehan | B60C 23/00 |
| | | | 137/493 |
| 3,115,033 A * | 12/1963 | Blowers | G01L 19/0007 |
| | | | 73/756 |
| 3,360,718 A | 12/1967 | Williams | |
| 3,763,421 A | 10/1973 | Glomski | |
| 4,026,621 A * | 5/1977 | Korba | F02P 17/06 |
| | | | 324/402 |
| 4,570,124 A * | 2/1986 | Fuchs | H01T 13/60 |
| | | | 324/401 |
| 6,714,015 B2 | 3/2004 | Whitehead | |
| 7,699,670 B1 * | 4/2010 | Jacques | H01R 13/111 |
| | | | 439/842 |
| 7,960,974 B1 | 6/2011 | Moninger | |
| 2010/0294023 A1 | 11/2010 | Thompson et al. | |
| 2012/0079877 A1 * | 4/2012 | Holl | G01M 15/02 |
| | | | 73/114.16 |
| 2012/0256531 A1 * | 10/2012 | Fuchs | H01T 13/54 |
| | | | 313/141 |

OTHER PUBLICATIONS

International Search Report & Written Opinion dated Jun. 7, 2016 from corresponding International PCT Application No. PCT/AU2016/050303, pages.

* cited by examiner

SPARK PLUG TESTING KIT

FIELD OF THE INVENTION

The present invention relates to a spark plug testing kit and in particular, but not necessarily entirely, to a spark plug testing kit that allows for the testing of a spark plug in a manner that substantially reduces the possibility of inadvertent ignition or explosion of fuel.

BACKGROUND AND SUMMARY OF THE INVENTION

In the embodiments provided herein, there is disclosed a portable, simple, safe and reliable spark plug testing kit for utilisation on small petrol engines. For example, the spark plug testing kit may be stored on a toolbox or the like and utilised where and when necessary such as, for example, problem solving a recalcitrant lawnmower.

The conventional problem-solving approach for small petrol engines is to remove the spark plug and place the spark plug on the engine block to form a ground connection whereafter the engine is cranked to view the spark within the spark gap of the spark plug. Such an approach is dangerous in that fuel may be inadvertently ignited, the operator electrocuted and/or debris falling into the combustion chamber via the spark plug opening.

As such, the spark plug testing kit according to the embodiments described herein allows for safe and convenient testing of petrol engines which eliminates or substantially ameliorates these problems while allowing for the clear and simple inspection of the spark of the spark plug. As will be appreciated from the ensuing description, the spark plug testing kit offers advantages in light of existing practices and arrangements in portability, ease-of-use, reliability and safety.

Figure 1:
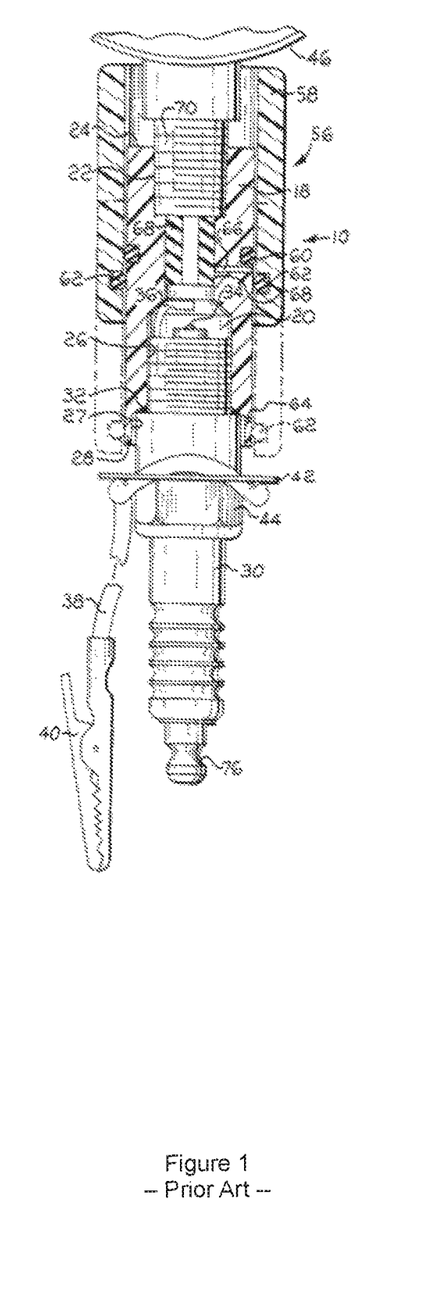
FIGS. 1-3 shows a spark plug electrical testing apparatus in accordance with the prior art.

In this regard, turning now to FIG. 1, there is shown a prior art arrangement as is disclosed in U.S. Pat. No. 4,570,124 A (Fuchs) (hereafter D1) which is considered as the closest art. D1 discloses a portable self-contained ignition system test diagnostic instrument for testing single cylinder and multi-cylinder spark ignited engines having an transparent spark chamber for visual inspection of a spark plug spark and an air pump for pressurising the spark chamber so as to visually inspect the spark plug and a differing pressures.

Specifically, as is disclosed in D1, to test a single cylinder engine, the ground wire 38 is connected by the test clip 40 to any suitable ground point on the engine. The spark plug wire is removed from the engine spark plug and mounted on the upper terminal 76 of the test spark plug 32. The spark plug is removed from the engine and the engine is cranked with a rope or electric starter wherein the ignition spark arc is visually observed through the transparent housing.

However, D1 suffers from several disadvantages including safety. For example, the removal of the spark plug allows potentially engine damaging debris from falling into the cylinder chamber.

Furthermore, the utilisation of the crocodile clip 14 connected to any suitable ground point on the engine is not reliable in that it does not always form a reliable electrical connection thereby potentially affecting the spark and is furthermore inconvenient to use in having to find and locate a suitable attachment point.

Furthermore, the electrical leads of D1 are exposed which may inadvertently result in the 19 kV electrocution of the operator.

Figure 2:
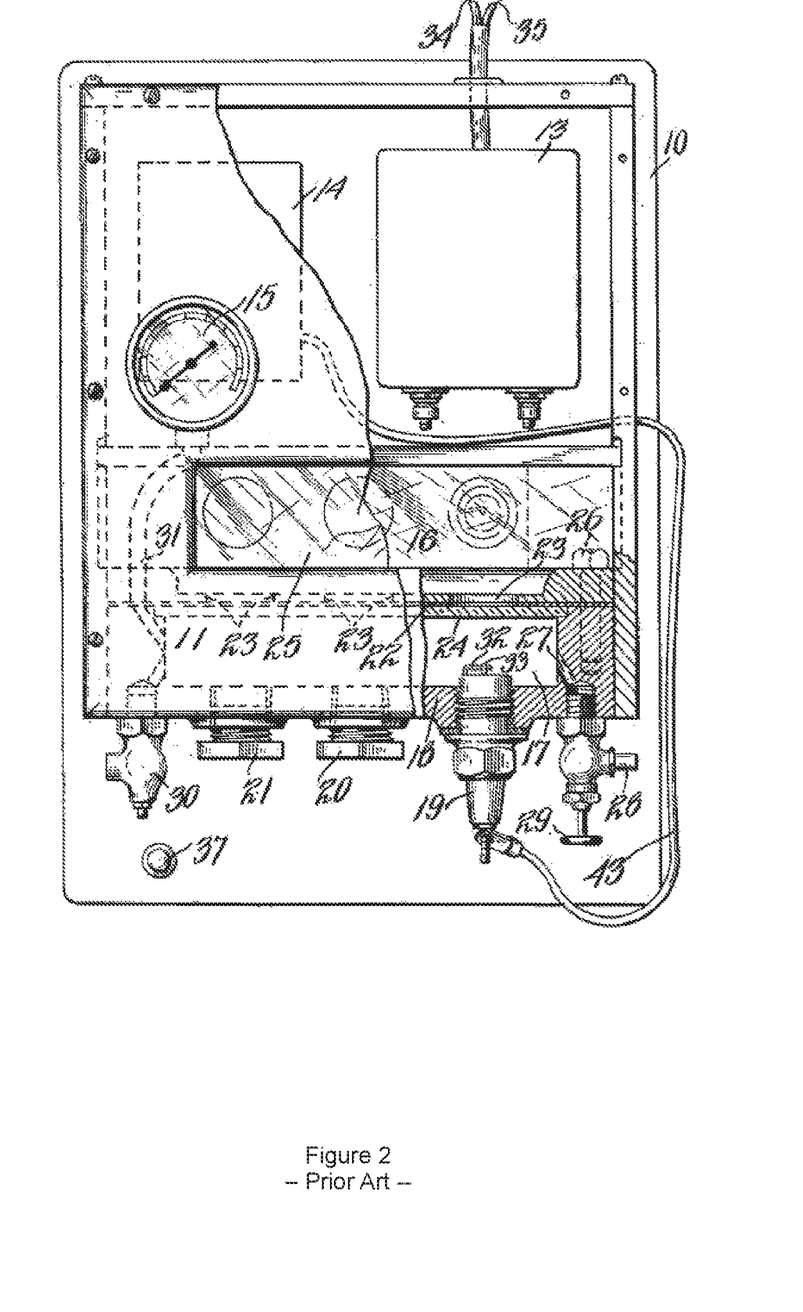

Furthermore, turning now to FIG. 2, there is shown a further prior art arrangement as is disclosed in U.S. Pat. No. 1,695,557 (Myers) (hereafter D2) discloses a device having a plurality of openings for receiving spark plugs therein for the purposes of testing the spark plugs at high air pressure. The device comprises a mirror for taking observations so as to reduce risk of injury in the event of glass blow out from residual gasoline explosion.

However, D2 is a "high-end" laboratory testing device suited for testing multiple spark plugs simultaneously being dissimilar from the portable and simple testing kit as is disclosed herein. Furthermore, D2 comprises inbuilt transformers, spark coils and the like for the purposes of powering the spark plugs. Furthermore, D2, in incorporating inbuilt electrical componentry, is incapable of testing the electrical distribution system/magneto and the like of the actual engine while simultaneously testing the spark plug.

Figure 3:
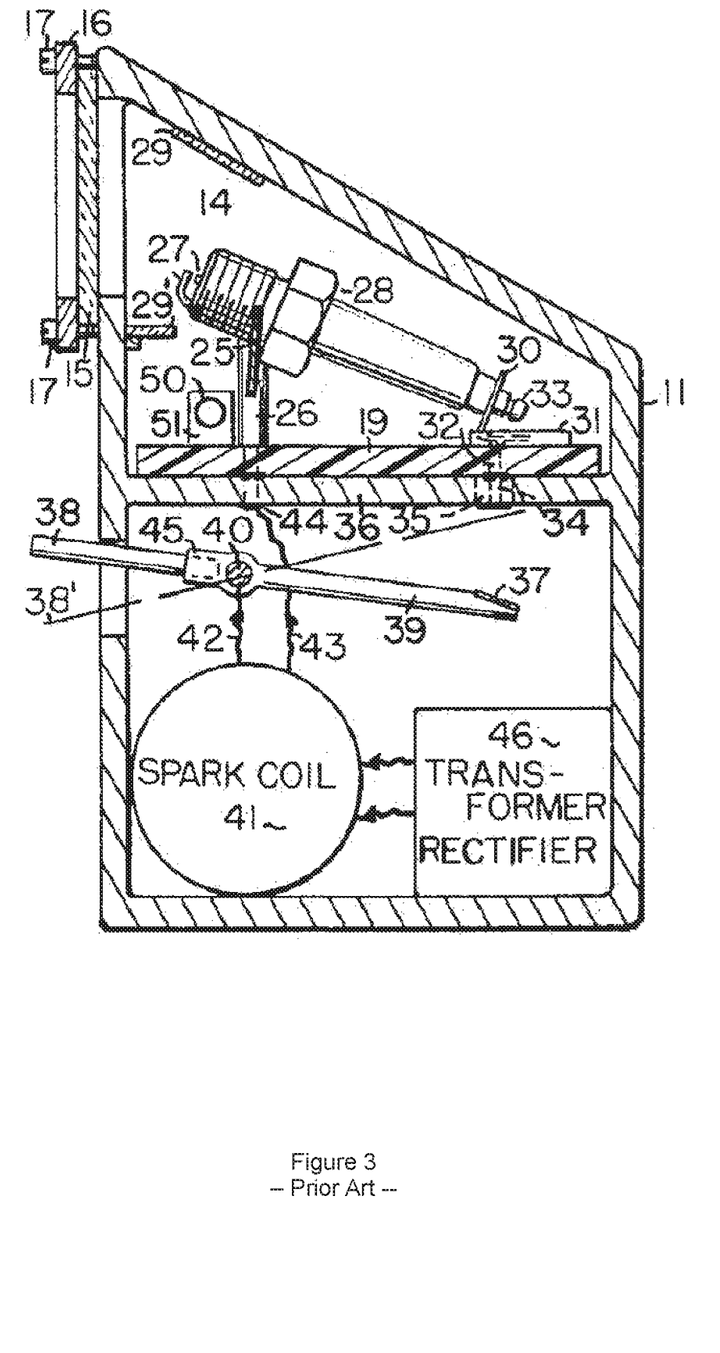
Figure 4:
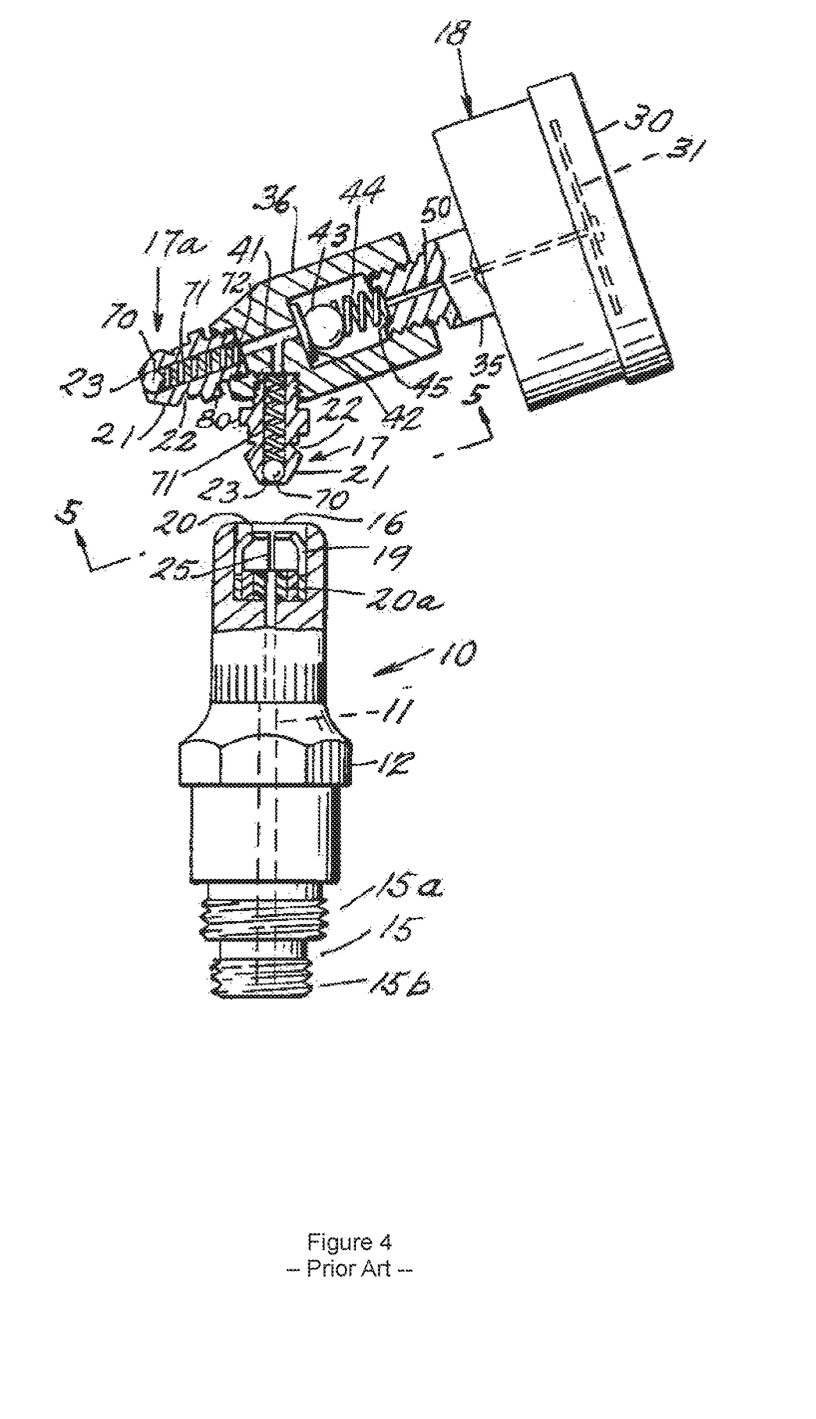
FIG. 4 shows a combustion chamber compression testing apparatus in accordance with the prior art.

Turning now to FIG. 3, there is shown a further prior art arrangement as is disclosed in U.S. Pat. No. 3,360,718 (WILLIAMS) (hereafter D3) which discloses a spark plug tester in which all of the plugs for an internal combustion engine can be simultaneously laid in an up-ended inclined position upon contacts on a tray for selective electrical testing within a pressurized housing. However, D3 is not dissimilar from D2 in the construction and arrangement thereof being suited for a laboratory environment, or and including in the incorporation of inbuilt electrical componentry and the like and is therefore not suited for testing of a spark plug in conjunction with the electrical distribution system of the actual engine itself as can the spark plug testing kit of the present embodiments disclosed herein.

As such, neither D2 nor D3 are capable of testing the electrical distribution system of the actual engine while simultaneously testing the spark plug.

As will be described in further detail below, the spark plug testing kit of the present invention comprises componentry that confers advantages in portability, simplicity, safety and reliability as compared to prior art arrangements.

Specifically, and as will be described in further detail below, the spark plug testing kit comprises an enclosed and transparent spark plug observation device. The spark plug observation device may be handheld in distinction to the arrangements disclosed in D2 and D3 so as to provide a clear view of the spark gap.

Now, the spark plug observation device is sealed for safety so as to prevent inadvertent ignition of gasoline vapour. In this regard, it is noted that the observation chambers of D2 and D3 do not prevent gasoline explosions but rather mitigate against injury from flying glass through the utilisation of mirrors.

The spark plug testing kit of the present embodiments further comprises a spark plug opening engaging device which may serve three purposes when engaging the spark plug opening in 1) allowing the depressurisation of the chamber so as to facilitate cracking, 2) preventing debris from entering the spark plug opening and 3) providing a secure electrical connection for the ground lead of the spark plug testing kit. Furthermore, in embodiments, the spark plug opening engaging device comprises a spark plug-type electrical terminal head allowing for the connection thereto utilising a conventional insulated spark plug connector and associated insulation boot.

As alluded to above, D1 utilises a crocodile clip 40 for the purposes of forming a ground connection to the engine block being tested.

However, the crocodile clip 40 of D1 does not provide a reliable electrical connection. Conversely, the spark plug opening engaging device forms a superior electrical connection not only with the engine block but also the earth electrical lead connected to the spark plug type terminal head.

Furthermore, the testing kit of D1 may allow debris to inadvertently enter the combustion chamber during testing and therefore damage the engine.

Furthermore, the spark plug opening engaging device provides an exhaust passage allowing the depressurisation of the chamber while being engaged within the spark plug opening to as to ease cranking.

In this regard, U.S. Pat. No. 3,115,033 A (Williams) (hereafter D4) discloses an internal combustion engine compression testing device configured for insertion into the spark plug opening of a cylinder and comprising a pressure gauge for compression testing.

However, D4 is directed to compression testing, not electrical testing of an engine and a skilled person could not be have reasonably been expected to combine the disclosures of D1 and D4 together given these differing and distinct skill sets. In this regard, it could generally be argued that engine compression testing and engine electrical systems would more likely be maintained by differing types of skilled persons having ordinary skill.

Furthermore, assuming that the skilled person would have sought to have improved the electrical connection of the earth lead 38 of D1, it could only be said that the hypothetical routine steps of the skilled person would extended only so far as to enhancing the electrical connection of the crocodile clip 40, such as by utilising another type of clip or engagement.

Furthermore, it could not be reasonably be expected for the skilled person to have sought to blocked or otherwise engaged the spark plug opening because the problem of debris falling into the chamber is not even recognised by the prior art on record (as is evidenced by the discloses of D1-D4). As such, it could not have been expected for the skilled person to have arrived, by routine steps alone, to a testing kit comprising the spark plug opening engaging device of the present arrangement is configured to prevent debris from falling into the chamber.

Furthermore, even assuming that the person skilled had arrived at the utilisation of a spark plug opening engaging device, it could not have been reasonably expected for such spark plug opening engaging device to have an exhaust to allow for the decompression of the chamber to ease cranking cranking.

Furthermore, and as also be appreciated from the ensuing description, the spark plug testing kit of the present arrangements provides further advantages in portability, safety and reliability as compared to prior art arrangements including prior art references D1-D4.

Specifically, as will be seen from the ensuing description, the spark plug testing kit is electrically isolated to prevent inadvertent shock to the user. Furthermore, the testing kit is able to be dismantled for the purposes of installation and removal wherein, during the installation stage, the spark plug is removed, the spark plug opening engaging device is inserted into the spark plug opening and tightened with a socket whereafter the spark plug is inserted into the observation device and whereafter the earth lead electrical connection boot is inserted over the distal terminal of the spark plug opening engaging device and further where after a terminal of the positive lead is inserted into the connector from the distributor. Furthermore, the spark plug observation device is able to be screwed together so as to isolate the spark from flammable liquids vapours and the like.

As such, as can be appreciated, the prior art, including that which is disclosed in references D1-D4 neither discloses nor suggests a testing kit arrangement comprising the features and functionality of that which is disclosed in accordance with the present embodiments.

It is to be understood that, if any prior art information is referred to herein, such reference does not constitute an admission that the information forms part of the common general knowledge in the art, in Australia or any other country.

SUMMARY OF THE DISCLOSURE

As such, with the foregoing in mind, in accordance with an embodiment, there is disclosed a spark plug testing kit comprising: a spark observation device; a spark plug opening engaging device; and an earth lead electrically connecting the spark observation device and the spark plug opening engaging device wherein: the spark observation device comprises a transparent observation chamber so as to allow for the viewing of the spark gap of a spark plug installed therein in use, and wherein the observation chamber may be substantially airtight so as to substantially prevent or reduce the possibility of the inadvertent ignition of fuel; and the spark plug opening engaging device: is configured for engaging a spark plug opening of the spark plug once the spark plug has been removed for observation so as to: substantially prevent debris from falling in through the opening; and serve as an engine block electrical connection contact for the earth lead; and comprises at least one exhaust for chamber decompression.

The spark plug opening engaging device may define an electrical terminal and wherein the earth lead terminates at a distal end with an earth lead electrical connection and wherein the terminal may be configured for releasable connection with the earth lead electrical connection.

The electrical terminal may conform substantially in shape and dimension to that of a terminal of the spark plug.

The spark plug opening engaging device may be substantially elongate and define a socket engaging profile for facilitating the engagement of a socket in use for turning into the spark plug opening.

The at least one exhaust may exit laterally from the spark plug opening engaging device.

The earth lead electrical connection may comprise an insulating connection boot.

The earth lead may terminate at a proximal end with a collar for electrical contact with the head of the spark plug.

The transparent observation chamber may be substantially dome shaped so as to allow for the viewing of the spark gap from differing angles.

The transparent observation chamber may comprise transparent polycarbonate.

The spark observation device may comprise a cylindrical portion and a terminal head portion and wherein the cylindrical portion and a terminal head portion are configured to fasten together to secure the spark plug therebetween in use.

The terminal head portion may comprise an annular extrusion comprising an outward thread for turning into a complimentary inner thread of the transparent observation chamber to house the spark gap in a transparent manner.

The spark plug testing kit may further comprise a positive lead for electrically connecting the spark observation device, the positive lead terminating at a distal end in a positive lead terminal.

The positive lead terminal may be substantially elongate and configured for insertion into a distributor lead connector.

The positive lead terminal may comprise a proximal insulation sheath.

Other aspects of the invention are also disclosed.

BRIEF DESCRIPTION OF THE DRAWINGS

Notwithstanding any other forms which may fall within the scope of the present invention, preferred embodiments of the disclosure will now be described, by way of example only, with reference to the accompanying drawings in which.

DESCRIPTION OF EMBODIMENTS

For the purposes of promoting an understanding of the principles in accordance with the disclosure, reference will now be made to the embodiments illustrated in the drawings and specific language will be used to describe the same. It will nevertheless be understood that no limitation of the scope of the disclosure is thereby intended. Any alterations and further modifications of the inventive features illustrated herein, and any additional applications of the principles of the disclosure as illustrated herein, which would normally occur to one skilled in the relevant art and having possession of this disclosure, are to be considered within the scope of the disclosure.

Before the structures, systems and associated methods relating to the spark plug testing kit are disclosed and described, it is to be understood that this disclosure is not limited to the particular configurations, process steps, and materials disclosed herein as such may vary somewhat. It is also to be understood that the terminology employed herein is used for the purpose of describing particular embodiments only and is not intended to be limiting since the scope of the disclosure will be limited only by the claims and equivalents thereof.

In describing and claiming the subject matter of the disclosure, the following terminology will be used in accordance with the definitions set out below.

It must be noted that, as used in this specification and the appended claims, the singular forms "a," "an," and "the" include plural referents unless the context clearly dictates otherwise.

As used herein, the terms "comprising," "including," "containing," "characterised by," and grammatical equivalents thereof are inclusive or open-ended terms that do not exclude additional, unrecited elements or method steps.

It should be noted in the following description that like or the same reference numerals in different embodiments denote the same or similar features.

Figure 5:
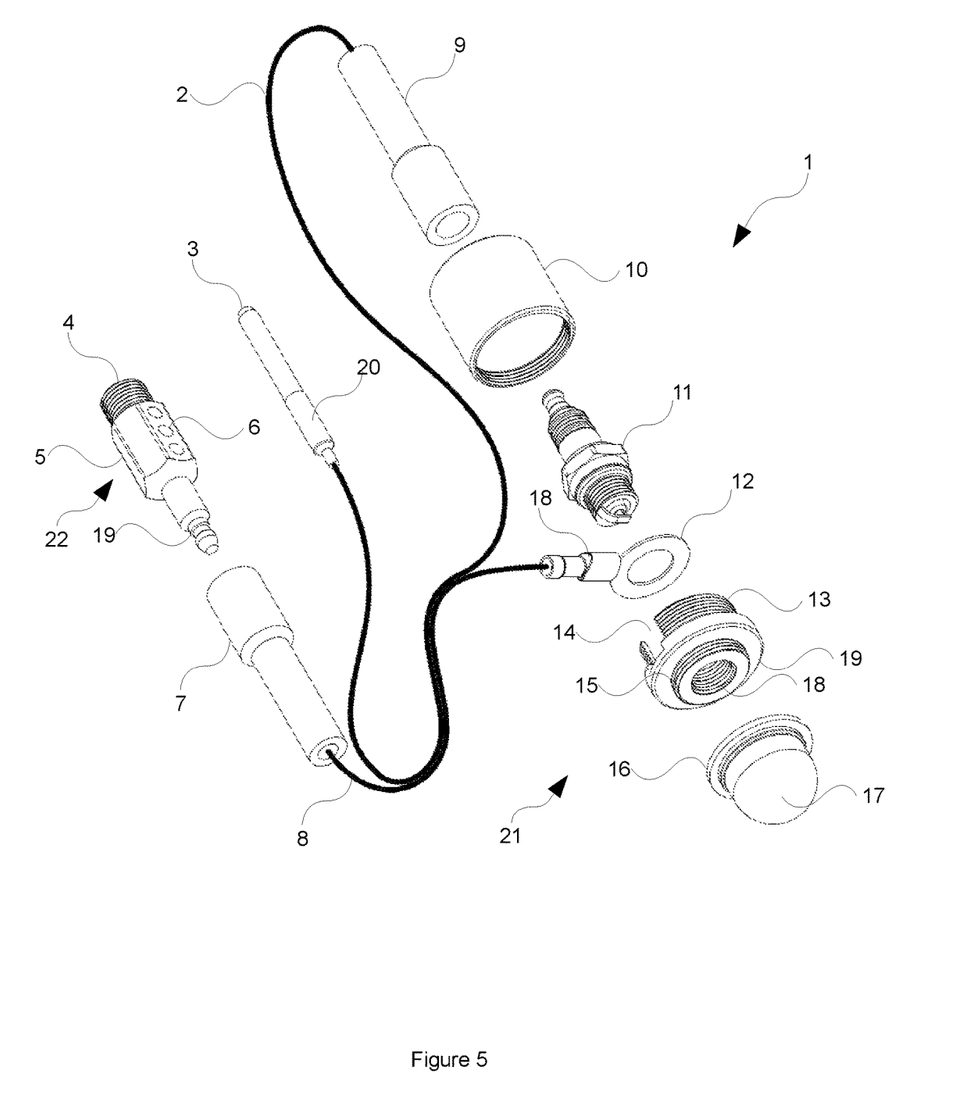
FIG. 5 shows a spark plug testing kit in accordance with a preferred embodiment of the present disclosure.

Turning now to FIG. 5, there is shown a spark plug testing kit 5 in accordance with a preferred embodiment of the present embodiments. As will be described in further detail below, the spark plug testing kit 1 confers advantages over existing testing devices in portability, reliability, safety and ease of use.

Now, the testing kit 1 comprises a spark observation device 21 for the visual inspection of a spark of a spark plug 11 in use. In this regard, the spark observation of article 21 comprises a transparent dome 17 within which the electrodes of the spark plug 11 are housed for the visual inspection of the spark in the gap of the spark plug 11.

The spark observation device 11 comprises various components which are fastened together so as to encase the spark plug 11 therein so as to isolate the spark of the spark plug 11 from potentially flammable external fluids, vapours and the like.

Such components may comprise a cylindrical section 10 into which an annular header 19 is turned by way of threading 13 so as to fasten the spark plug 11 therebetween. In doing so, the head of the spark plug 11 extends through the opening of the annular head 19 so as to be visible from within the dome 17. In this regard, the opening of the annular head 19 itself comprises threading 18 for mating with the threading of the head of the spark plug 11.

Furthermore, as can be seen, the annular head 19 may comprise an annular protrusion defining a peripheral thread 15 for turning into a corresponding interior thread 16 of the transparent dome 17.

The annular head 19 may comprise a cutout 14 for the accommodation of an electrical lug 18 therein connecting an annular is connection ring 12 to an earth lead 8.

Figure 7:
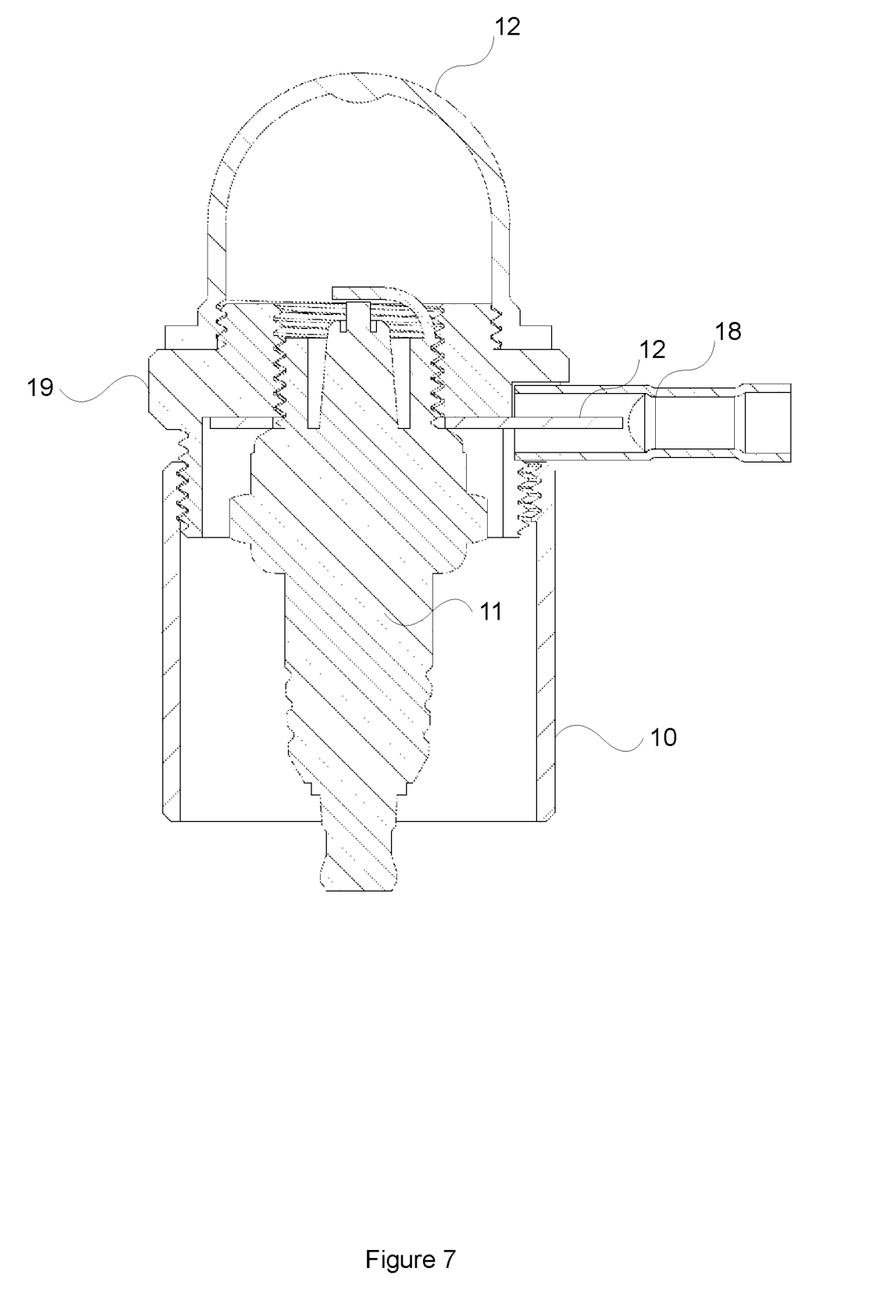
FIG. 7 shows the spark observation device of the testing kit of FIG. 5 in accordance with a preferred embodiment of the present disclosure.

Turning now to FIG. 7, there is shown a cross-sectional elevation view of the spark observation device 21 when assembled. As can be seen, the spark observation vice 21 securely engages the spark plug 11 therein and isolates the spark gap of the spark plug 11 from external combustible fluids, vapours and the like while yet allowing for the visual inspection of the spark gap of the spark plug 11 from differing viewing angles.

As can be appreciated, the construction of the spark observation device 21 allows for the observation device 21 to be handheld if desired. Furthermore, the construction of the spark observation device 21 is particularly robust being resistance to damage if dropped, for example. Furthermore, in embodiments, the transparent dome 17 may be manufactured from shock resistant transparent polycarbonate or the like.

Now, the testing kit 1 further comprises the spark plug opening engaging device 22. The spark plug opening engaging device 22 is configured for engaging the opening of the spark plug 11 once the spark plug 11 has been removed. In this regard, the opening engaging device 22 comprises threading 4 for turning into the opening. In this regard, so as to facilitate turning, the opening engaging device 22 may comprise a hex nut profile 5 so as to allow the engagement thereof by a socket. As can be appreciated, the opening engaging device 22 comprises a profile not dissimilar to that of the spark plug 11 itself thereby allowing the opening engaging device 22 to be turned into the opening in a similar manner utilising similar tools.

Figure 6:
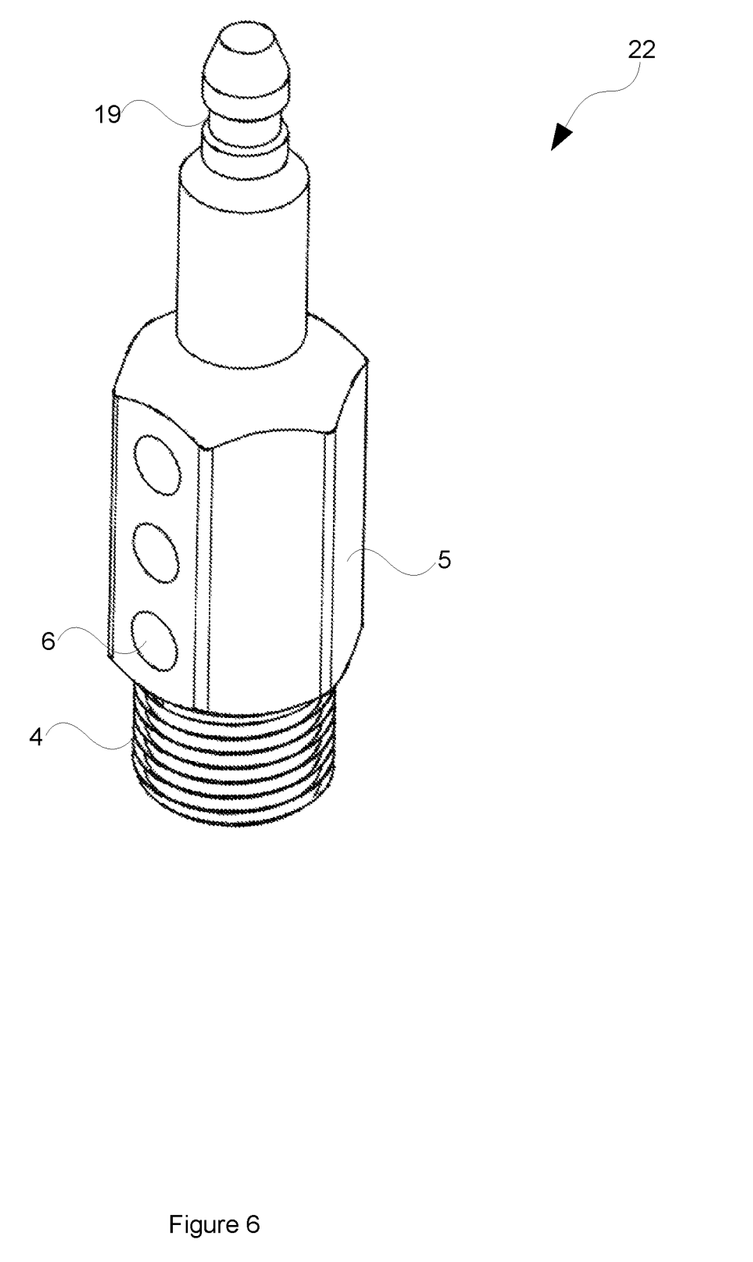
FIG. 6 shows a spark plug opening engaging device of the spark plug testing kit of 5 in accordance with a preferred embodiment of the present disclosure.

FIG. 6 shows a magnified view of the opening engaging device 22.

As alluded to above in the background section, the opening engaging device 22 may serve several purposes.

Specifically, the first purpose served by the opening engaging device 22 is the prevention of debris from falling into the spark plug opening. As can be seen, the engagement of the opening by the opening engaging device 22 leaves no room for debris to fall into the opening and thereby potentially damage the engine.

Furthermore, a second purpose served by the opening engaging device 22 is allowing the decompression of the chamber during testing including to ease cranking. In this manner, the engine may be cranked with one hand with the other hand holding the observation device 21.

In this regard, the opening engaging device 22 comprises at least one exhaust 6 for allowing pressurised gases to escape from the chamber via the opening and out of the exhaust 6. In the embodiment shown, the device 22 comprises three collocated exhausts 6 arranged on a lateral face of the device 22. In embodiment, the interior of the device 22 may comprise a mesh, ball and spring apparatus or the like so as to even further prevent the entry of debris via the exhaust 6 into the opening.

Furthermore, a third purpose served by the opening engaging device 22 is for the purposes of providing a superior electrical connection for the earth lead 8 of the testing kit 1. Specifically, as can be seen, the opening engaging device 22 comprises a distal terminal 19 to which the earth lead 8 may be selectively connected. Specifically, in a preferred embodiment, the earth lead 8 terminates in a conventional insulated spark plug boot 7 which engages over the terminal 19 when required.

As can be appreciated, the removability of the of the boot 7 from the terminal 19 facilitates the installation of the opening engaging device 5 by way of the aforementioned socket whereafter, once installed, the boot 17 may easily be connected to the terminal 19.

The testing kit 1 further comprises a positive lead 2 which is connected by way of conventional spark plug boot 9 to the terminal of the spark plug 11 for testing. As can be seen, the other end of the positive lead 2 terminates in an elongate terminal 3 configured for insertion into the connection from the distributor. A proximal end of the terminal 3 may comprise a sheath 20 of electrical insulation for handling safety.

In this manner, as can be appreciated, the terminal 3 allows for the simple installation wherein, the terminal 3 may be simply inserted into the connection from the distributor and the opposite spark plug boot 9 engaged over the terminal of the spark plug 11 for testing.

In this manner, the spark plug testing kit 11 may be installed in a matter of minutes and yet provide a secure electrical connection, safety from inadvertent ignition, prevention of debris entering the chamber, electrical isolation and the like.

Interpretation

Embodiments:

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the above description of example embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description of Specific Embodiments are hereby expressly incorporated into this Detailed Description of Specific Embodiments, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Different Instances of Objects

As used herein, unless otherwise specified the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

Specific Details

In the description provided herein, numerous specific details are set forth. However, it is understood that embodiments of the invention may be practiced without these specific details. In other instances, well-known methods, structures and techniques have not been shown in detail in order not to obscure an understanding of this description.

Terminology

In describing the preferred embodiment of the invention illustrated in the drawings, specific terminology will be resorted to for the sake of clarity. However, the invention is not intended to be limited to the specific terms so selected, and it is to be understood that each specific term includes all technical equivalents which operate in a similar manner to accomplish a similar technical purpose. Terms such as "forward", "rearward", "radially", "peripherally", "upwardly", "downwardly", and the like are used as words of convenience to provide reference points and are not to be construed as limiting terms.

Comprising and Including

In the claims which follow and in the preceding description of the invention, except where the context requires otherwise due to express language or necessary implication, the word "comprise" or variations such as "comprises" or "comprising" are used in an inclusive sense, i.e. to specify the presence of the stated features but not to preclude the presence or addition of further features in various embodiments of the invention.

Any one of the terms: including or which includes or that includes as used herein is also an open term that also means including at least the elements/features that follow the term, but not excluding others. Thus, including is synonymous with and means comprising.

Scope of Invention

Thus, while there has been described what are believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

Although the invention has been described with reference to specific examples, it will be appreciated by those skilled in the art that the invention may be embodied in many other forms.

The invention claimed is:

1. A spark plug testing kit comprising:
a spark observation device having a transparent observation chamber for viewing a spark gap of a spark plug installed therein in use;
positive and earth leads for electrically connecting the spark observation device at respective proximal ends thereof; and
a spark plug opening engaging device, wherein:
the spark plug opening engaging device is elongate;
defines threading at a first end thereof for turning into a spark
plug opening of an engine block; and
defines an elongate electrical connector nut at a second end thereof, opposite the first end, where a side member spans between the first end and the second end;
a distal end of the earth lead comprises an electrical connector configured for engagement over the elongate electrical connector nut and having an insulative sheath thereabout; and
the spark plug opening engaging device defines at least one engine depressurisation exhaust port through the side member of the spark plug opening engaging device, the depressurisation exhaust port permitting flow of fluid from inside the spark plug opening engaging device to outside the spark plug opening engaging device.

2. A spark plug testing kit as claimed in claim 1, wherein the proximal end of the earth lead comprises a collar for electrical contact with the head of the spark plug.

3. A spark plug testing kit as claimed in claim 1, wherein the transparent observation chamber is substantially dome shaped so as to allow for the viewing of the spark gap from differing angles.

4. A spark plug testing kit as claimed in claim 3, wherein the transparent observation chamber comprises transparent polycarbonate.

5. A spark plug testing kit as claimed in claim 1, wherein the spark observation device comprises a cylindrical portion and a terminal head portion and wherein the cylindrical portion and a terminal head portion are configured to fasten together to secure the spark plug therebetween in use.

6. A spark plug testing kit as claimed in claim 5, wherein the terminal head portion comprises an annular extrusion comprising an outward thread for turning into a complimentary inner thread of the transparent observation chamber to house the spark gap in a transparent manner.

7. A spark plug testing kit as claimed in claim 1, wherein a distal end of the positive lead comprises a positive lead terminal.

8. A spark plug testing kit as claimed in claim 7, wherein the positive lead terminal is substantially elongate for insertion into a distributor lead connector.

9. A spark plug testing kit as claimed in claim 8, wherein the positive lead terminal comprises a proximal insulation sheath.

10. A spark plug testing kit as claimed in claim 1, wherein the spark plug opening engaging device comprises a hex nut profile cross section between the threading and the elongate electrical connector nut.

11. A spark plug testing kit as claimed in claim 1, wherein the elongate electrical connector nut defines an end section and a waist in from the end section and wherein the waist has a diameter less than a maximum diameter of the end section.

12. The spark plug testing kit as claimed in claim 1, wherein each of the at least one engine depressurisation exhaust port expels fluid from the inside space in a single direction.

13. The spark plug testing kit as claimed in claim 6, further comprising a cut-out formed in the terminal head portion for passage of a collar of the earth lead.

* * * * *